United States Patent [19]

Miyawaki

[11] Patent Number: 4,823,014

[45] Date of Patent: Apr. 18, 1989

[54] POSITION DETECTING DEVICE USABLE WITH AN OBJECT HAVING A SURFACE

[75] Inventor: Mamoru Miyawaki, Tokyo, Japan

[73] Assignee: Canon Kabushiki Kaisha, Tokyo, Japan

[21] Appl. No.: 65,569

[22] Filed: Jun. 23, 1987

[30] Foreign Application Priority Data

Jun. 27, 1986 [JP] Japan ................................ 61-149691

[51] Int. Cl.$^4$ ............................................. G01B 11/00
[52] U.S. Cl. ................................. 250/561; 250/201; 250/227; 356/375
[58] Field of Search ................. 250/561, 201 AF, 227; 356/1, 376, 381, 4, 375

[56] References Cited

U.S. PATENT DOCUMENTS

| | | | |
|---|---|---|---|
| 4,230,940 | 10/1980 | Minami et al. | 250/201 AF |
| 4,363,962 | 12/1982 | Shida | 250/201 AF |
| 4,692,611 | 9/1987 | Hoogenboom | 250/561 |
| 4,698,513 | 10/1987 | Tojo et al. | 250/561 |
| 4,723,845 | 2/1988 | Mizutani et al. | 250/561 |

*Primary Examiner*—Edward P. Westin
*Attorney, Agent, or Firm*—Fitzpatrick, Cella Harper & Scinto

[57] ABSTRACT

A position detecting device, usable in a projection exposure apparatus for optically projecting a pattern of a reticle upon a wafer by use of a projection lens system, for detecting the position of the wafer with respect to an imaging plane of the projection lens system is disclosed. The position detecting device includes a light source from which light is projected upon the surface of the wafer. The light reflected by the wafer surface is converted by a photoelectric converting element into an electric signal, on the basis of which the position of the wafer is detected. Upon the projection of the position detecting light, the light is controlled by an optical integrated-circuit such as an optical waveguide type element. This allows, with a simple and compact structure, the irradiation of the wafer surface with lights of different wavelengths from plural light sources and/or the irradiation of different locations on the wafer surface with the light.

9 Claims, 3 Drawing Sheets

POSITION DETECTING DEVICE USABLE WITH AN OBJECT HAVING A SURFACE

FIELD OF THE INVENTION AND RELATED ART

This invention relates generally to a position detecting device and, more particularly, to a position detecting device, which is usable in the field of manufacture of semiconductor devices and which is applicable to a semiconductor device manufacturing projection exposure apparatus arranged to project a pattern of a reticle upon a semiconductor wafer by use of a projection lens system, for detecting the position of the surface of the wafer relative to an imaging plane of the projection lens system.

Step-and-repeat type projection exposure apparatuses are known as "steppers" wherein a projection lens system is used to project images of a pattern, formed on a reticle, upon different portions of a wafer in a step-and-repeat manner. Such projection exposure apparatuses generally require an automatic focus control system for bringing the surface of the wafer into exact coincidence with an imaging plane of the projection lens system so that the reticle pattern is sharply transferred onto each of the different portions (shot areas) of the wafer by the projection exposure. An example of such automatic focus control system usable in the projection exposure apparatus is disclosed in U.S. patent application Ser. No. 931,997 filed Nov. 18, 1986 and assigned to the same assignee of the subject application. The disclosed focus control system uses a plurality of light-emitting means, such as light-emitting diodes, for producing lights of different wavelengths such as, for example, a visible light and a near-infrared light. These lights are combined by means of an optical system and the resultant light having plural wavelengths is projected inclinedly upon a photoresist layer applied to the wafer surface. The light reflected by the surface of the resist layer is received by a position detecting sensor. On the basis of the shift of the position of incidence, upon the position detecting sensor, of the light reflected from the photoresist surface, the shift of the photoresist surface in the direction of the optical axis of the projection lens system is detected. Since, in this focus control system, lights of plural and different wavelengths are used, the interference of light rays reflected from the wafer surface is advantageously averaged to a greater extent. By this averaging effect, the wafer position can be detected exactly such that accurate and satisfactory automatic focus control is attainable.

SUMMARY OF THE INVENTION

It is an object of the present invention to provide an improved position detecting device which is effectively applicable to an automatic focus control system in a step-and-repeat type projection exposure apparatus.

It is another object of the present invention to provide a position detecting device for use in an automatic focus control system of a step-and-repeat type projection exposure apparatus, wherein position detecting lights from plural light sources can be combined by a more simple structure that requires only easy axial adjustment of the lights from the light sources.

It is a further object of the present invention to provide a position detecting device which is effectively applicable to an automatic focus control system in a step-and-repeat type projection exposure apparatus and which is capable of detecting, with a simple and compact structure, the position of the wafer surface with respect to plural points thereon.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
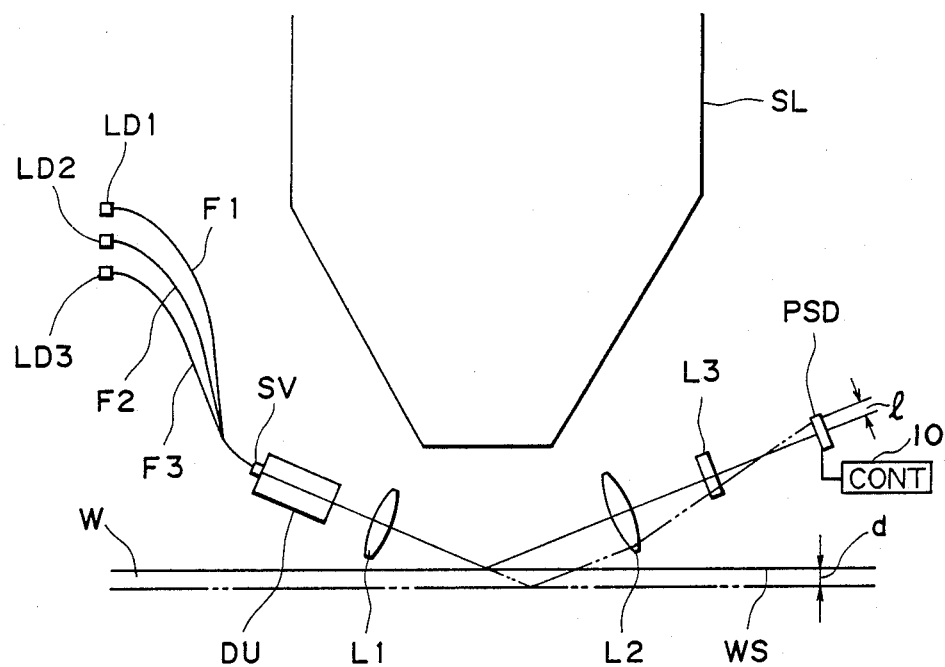
FIG. 1 is a schematic side view showing a general arrangement of a position detecting device according to one embodiment of the present invention.

Referring first to FIG. 1, there is shown a major portion of a step-and-repeat type projection exposure apparatus, called "stepper", into which a position detecting device according to an embodiment of the present invention is incorporated. The exposure apparatus includes a projection lens system SL for optically projecting a pattern formed on a reticle (not shown), when it is irradiated with a light of a predetermined wavelength $\lambda 0$ supplied from a photoprinting light source (also not shown), upon the surface of a wafer W so as to photoprint the reticle pattern upon a resist material applied to the wafer W surface. The projection lens system SL is corrected, in respect to aberrations, for the wavelength $\lambda 0$. The position detecting device includes plural semiconductor lasers (three in this example) LD1, LD2 and LD3 adapted to produce, respectively, lights of wavelengths $\lambda 1$, $\lambda 2$ and $\lambda 3$ which are different from each other and from the photoprinting wavelength $\lambda 0$. Optical fiber means F1, F2 and F3 are provided to guide the lights from the semiconductor lasers to a light deflecting device DU. Disposed in front of this light deflecting device DU is a light coupler SV which is provided to introduce the lights of different wavelengths from the lasers LD1–LD3 into a waveguide provided in the light deflecting device DU. The coupler SV comprises a silicon substrate on which V-shape grooves are formed, by etching, to fixedly hold the optical fibers F1–F3, respectively. The light deflecting device DU is arranged to deflect (more specifically, to scanningly deflect) the laser beams of different wavelengths in a direction perpendicular to the sheet of the drawing of FIG. 1. The position detecting device further includes cylindrical lenses L1, L2 and L3. Of these lenses, the cylindrical lenses L1 and L2 each has a focusing or light-collecting function in a plane of the sheet of the drawing of FIG. 1. On the other hand, the cylindrical lens L3 has a focusing or light-collecting function in a direction perpendicular to the sheet of FIG. 1. A position detecting sensor PSD is of a well-known type, producing an output which is variable in accordance with the position of incidence of light upon its light-receiving surface. The reference character WS denotes the surface of the wafer W (or the surface of the resist layer applied to the wafer W).

In operation, the laser beams emitted from the lasers LD1, LD2 and LD3 and having wavelengths λ1, λ2 and λ3, respectively, are guided by the fibers F1, F2 and F3, respectively, and are introduced by way of the coupler SV into the light deflecting device DU. In this light deflecting device DU, the path for the position detecting light to be emitted from the deflecting device is determined or specified. The light emitted from the light deflecting device DU is collected and projected upon the wafer surface WS by the cylindrical lens L1. The light reflected by the wafer surface WS is received by the cylindrical lens L2 and is imaged thereby upon the light-receiving surface of the position detecting sensor PSD.

Assuming now that the wafer surface WS shifts in the direction of the optical axis of the projection lens system SL by a distance d, and if the magnification of the cylindrical lens L2 is denoted by β, then, the error l (the amount of positional deviation) of the position of incidence, of the wafer-reflected light, upon the light-receiving surface of the position detecting sensor PSD can be expressed as follows:

$$l = 2\beta d$$

Accordingly, by determining the positional deviation l on the basis of the output of the position detecting sensor PSD, there is obtained an automatic focusing signal that corresponds to the shift, of an amount d, of the wafer surface WS position from a predetermined reference plane or the imaging plane of the projection lens system SL in the direction of the optical axis of the projection lens system SL. The determination of the positional deviation l and the calculation of the shift d are carried out in a controller 10 connected to the position detecting sensor PSD.

For the detection of such an automatic focusing signal, the lasers LD1-LD3 may be energized in sequence so that the laser beams of the wavelengths λ1-λ3 are emitted in sequence. From the intensity characteristics of the outputs produced sequentially from the sensor PSD, one of the wavelengths which is less affected by the interference between the light rays from the resist surface of the wafer pattern surface and by the multiple interference within the resist layer, may be selected by an operator. Of course, such selection may be made automatically on the basis of the intensity characteristics of the outputs from the sensor PSD. Further, plural wavelengths may be selected, since use of plural wavelengths is advantageous in respect to the averaging effect.

In the present embodiment, the photoprinting wavelength λ0 is an ordinarily used one such as, for example, 436 nm. On the other hand, the wavelengths λ1, λ2 and λ3 supplied respectively from the lasers LD1, LD2 and LD3 are all in a range from 600 nm to 850 nm significantly different from the photoprinting wavelength λ0. Therefore, the laser beams from the lasers LD1-LD3 hardly sensitize the resist material applied to the wafer, with the result that an unwanted pattern is not photoprinted upon the wafer during the detection of the automatic focusing signal.

Figure 2:
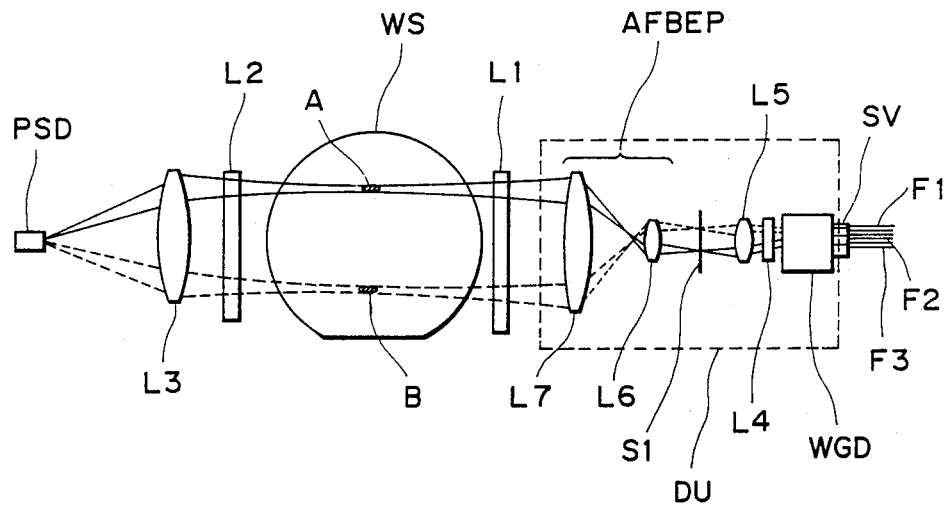
FIG. 2 is a schematic plan view of the position detecting device of the FIG. 1 embodiment.

FIG. 2 shows the optical arrangement of the position detecting device of the FIG. 1 embodiment, as seen from the projection lens system SL side. In FIG. 2, the optical arrangement is illustrated inversely with respect to the horizontal direction as compared with the illustration of FIG. 1, such that in FIG. 2 the light advances from the right to the left.

In FIG. 2, the broken-line box denotes the light deflecting device DU described hereinbefore. In this light deflecting device DU, there are provided a waveguide type deflector WGD, a cylindrical lens L4, a lens system L5 and an a focal beam expander AFBEP comprising lenses L6 and L7. The deflector WGD is of the type that the laser beams from the fibers F1–F3 and having wavelengths λ1–λ3 are deflected, with a variable deflection angle, by using Bragg diffraction effect. Details of the deflector WGD will be described later with reference to FIG. 3.

The laser beams of the wavelengths λ1–λ3 as introduced from the fibers F1–F3 into the light deflecting device DU are scanningly deflected by the waveguide type deflector WGD, and the thus deflected beams are emitted from the left-hand end face of the deflector WGD, as viewed in FIG. 2. While the thus deflected and emitted light advances while expanding, due to the diffraction, in the direction of the depth of the waveguide (i.e. the direction perpendicular to the sheet of FIGS. 2 or 3), it is converted into a parallel light by means of the cylindrical lens L4. The light from the cylindrical lens L4 is incident on the lens L5. In this embodiment, the lens L5 is arranged so as to be substantially telecentric on the image field side with respect to the laser beams deflected by the deflector WGD and passed through the cylindrical lens L4. Therefore, the central ray of each of the laser beams having been deflected by the deflector WGD is substantially perpendicularly incident upon a plane S1 such as illustrated in FIG. 2. The laser beams from the lens L5 enter into the a focal beam expander AFBEP, whereby each laser beam is shifted, with the deflection by the deflector WGD, in parallel to the optical axis of the optical system shown in FIG. 2. For example, the laser beam as it is scanningly deflected by the deflector WGD is shifted from the solid-line position to the broken-line position, as illustrated in FIG. 2. It is to be noted that, in the present embodiment, the optical system is so arranged that the laser beam, as deflected by the light deflecting device DU, is inclinedly projected and incident upon the wafer surface WS when the laser beam is converged to the minimum. In other words, the wafer surface WS is irradiated with the beam waist of the laser beam being deflected. This arrangement is adopted so as to minimize the spot diameter of the laser beam when it is incident upon the wafer surface WS. Thus, in the present embodiment, the wafer surface WS is scanned with the beam waist of the laser beam being deflected by the light deflecting device DU. It will be readily understood that, during the scan of the wafer surface WS, the light reflected by the wafer surface is imaged at the same location on the light-receiving surface of the position detecting sensor PSD by the cylindrical lens L3, provided that the portion of the wafer surface WS being irradiated with the scanningly deflected laser beam (i.e. the beam spot moving from the position A to the position B in FIG. 2) is exactly at a constant position with respect to the direction of the optical axis of the projection lens system SL.

With the optical arrangement of the present embodiment, as described, an automatic focusing signal with respect to the point A (FIG. 2) on the wafer surface WS is detectable in the manner having been described with reference to FIG. 1. Further, by deflectingly moving the laser beam spot along the wafer surface WS to the point B (FIG. 2) by use of the light deflecting device DU, an automatic focusing signal with respect to the point B is also detectable. In this manner, plural automatic focusing signals concerning plural points on the wafer surface WS are obtainable.

Figure 3:
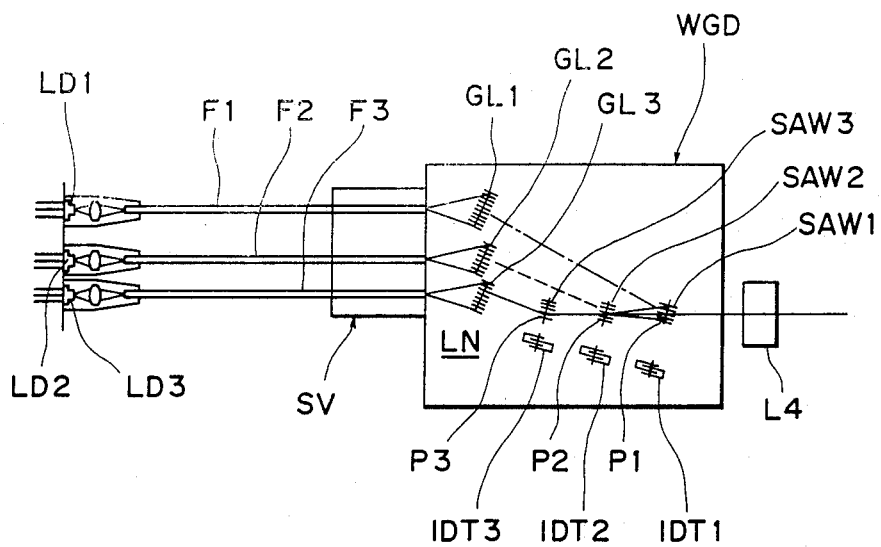
FIG. 3 is a schematic view showing details of a light deflector used in the FIG. 1 device.

Referring now to FIG. 3 showing details of the waveguide type deflector WGD, the deflector comprises an optical waveguide LN. The waveguide LN may comprise a LiNbO$_3$ substrate in which titanium (Ti) or proton is diffused. The deflector WGD is adapted to deflect the laser beams from the fibers F1-F3 under the influence of an acoustooptic effect, and has grating lenses GL1, GL2 and GL3 formed on the waveguide LN, as well as interdigitating electrodes IDT1, IDT2 and IDT3 also formed on the waveguide LN for producing surface elastic waves as schematically illustrated at SAW1, SAW2 and SAW3.

The laser beams from the fibers F1-F3 and having the wavelengths $\lambda 1-\lambda 3$ enter into the deflector WGD through the left-hand end face of the deflector as viewed in FIG. 3. Each of the laser beams incident upon the deflector WGD advances divergently in the waveguide LN, as schematically illustrated in FIG. 3. The divergent laser beam enters into corresponding one of the grating lenses GL1-GL3, each of which is of the off-axis type. By this grating lens, the divergent laser beam is converted into a parallel light directed to an associated one of deflection points P1, P2 and P3. On the other hand, the surface elastic waves SAW1-SAW3 are produced by applying high-frequency electric voltages to the interdigitating electrodes IDT1-IDT3, respectively. By these surface elastic waves SAW-1-SAW3, the parallel lights from the grating lenses GL1-GL3 are deflected at the points P1-P3, respectively. More specifically, each parallel light is deflected under the influence of the Bragg diffraction effect. The angle of diffraction by each surface elastic wave can be changed by changing the frequency of the electric voltage to be applied to corresponding one of the interdigitating electrodes IDT1-IDT3. Accordingly, the laser beam from the grating lens GL1 can be deflected at the point P1 in a desired direction. Similarly, the laser beams from the grating lenses GL2 and GL3 can be deflected at the points P2 and P3, respectively, in desired directions.

In a case where an optical waveguide type deflector such as at WGD is used, the laser beams of the different wavelengths are deflected at different positions such as denoted at P1-P3 in FIG. 3. However, the positional differences or intervals between these points P1-P3 are very small such as of an order of 2-3 mm. Therefore, each laser beam after being deflected by the deflector can be incident upon the wafer surface WS with its central ray being projected substantially in parallel to the optical axis of the lens optical system shown in FIG. 2.

Figure 4:
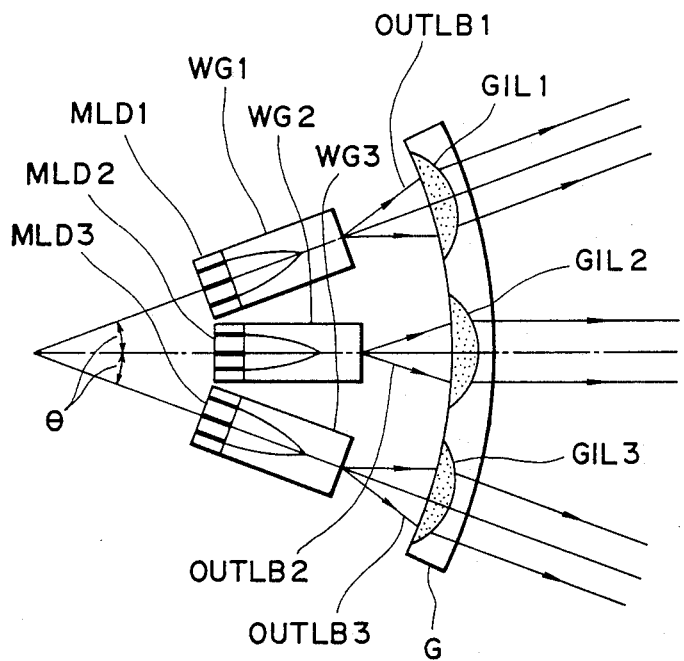
FIG. 4 is a section schematically showing a major portion of a position detecting device according to another embodiment of the present invention.

Referring now to FIG. 4, description will be made of a position detecting device according to another embodiment of the present invention.

FIG. 4 shows a major portion of the position detecting device of the second embodiment. Briefly, the position detecting device of the present embodiment is of a non-scan type as compared with the first embodiment. As shown in FIG. 4, the present embodiment uses a plurality of semiconductor-laser arrays MLD1, MLD2 and MLD3, a plurality of optical waveguide type light-combining circuits WG1, WG2 and WG3, and a plurality of gradient index type lens elements GIL1, GIL2 and GIL3. All of these optical components are provided in substitution for the portion, of the optical system shown in FIGS. 1 or 2, from the light source (lasers LD1-LD3) to the cylindrical lens L4 inclusive. The gradient index type lenses GIL1-GIL3 are formed on a curved glass substrate.

The principle of operation of the FIG. 4 embodiment will now be described. Each of the laser arrays MLD1-MLD3 is adapted to emit laser beams of different wavelengths $\lambda 1-\lambda n$ which are directed and combined into one laser beam by corresponding one of the waveguide type beam combining circuits WG1-WG3. Namely, the laser beams from each laser array are guided and finally directed along one channel waveguide. The thus guided laser beam is emitted divergently from the end face of the corresponding waveguide circuit WG1, WG2 or WG3, such as schematically illustrated at OUTLB1, OUTLB2 or OUTLB3 in FIG. 4, and enters into corresponding one of the gradient index type lenses GIL1-GIL3 provided on the curved glass substrate denoted at G in FIG. 4. By this gradient index type lens, the diverging laser beam is converted into a parallel light.

In the FIG. 4 arrangement, the middle portion including the laser array MLD2, the waveguide type light-combining circuit WG2 and the gradient index type lens GIL2 has a common optical axis, and these components are so disposed that their common optical axis extends in the same direction as the optical axis of the lens L1 of the FIG. 1 embodiment. On the other hand, the upper portion including the laser array MLD1, the waveguide WG1 and the gradient index lens GIL1 has a common optical axis which is inclined relative to the optical axis of the middle portion by an angle $\theta$ which is in a range of 8 to 12 degrees. Similarly, the lower portion including the laser array MLD3, the waveguide WG3 and the gradient index lens GIL3 has a common axis which is inclined relative to the optical axis of the middle portion by a similar angle $\theta$. In operation, one or more wavelengths effective for the detection of automatic focusing signals (e.g. the wavelength or wavelengths with which the reflection factor is less decreased due to the multiple interference within the resist laser) are selected and, thereafter, the laser beam of the selected wavelength or wavelengths is emitted sequentially from the laser arrays MLD1-MLD3. By doing so, the wafer surface WS position with respect to plural points on the wafer can be detected, similarly as the case of the beam deflection executed in the first embodiment.

In the present embodiment, as compared with the FIG. 1 arrangement, a large angle of beam deflection is easily attainable. Accordingly, the present embodiment is preferable in the point that it permits easy detection of automatic focusing signals with respect to the peripheral portion of the wafer.

Each of the laser arrays MLD1-MLD3 of the present embodiment can be formed on a GaAs substrate or an InP substrate. On the other hand, each of the optical waveguide type light-combining circuits WG1-WG3 may be provided by an optical waveguide of any type provided that the transmission loss is low. For example, the waveguide can be formed of a glass substrate having been subjected to an ion exchanging process. Alternatively, it may be made by diffusing titanium (Ti) or proton into a LiNbO$_3$ substrate. As a further alternative, the waveguide may be made by diffusing, by heat, niobium (Nb) into a LiTaO$_3$ substrate. As a yet further alternative, the waveguide may be made by forming a ridge structure on a GaAs substrate or an InP substrate.

While gradient index type lenses such as at GIL-1–GIL3 are used in the present embodiment, use of such gradient index type lenses is not indispensable. Each of such gradient index type lenses may be replaced by a combination of a plurality of ordinary lenses.

Figure 5:
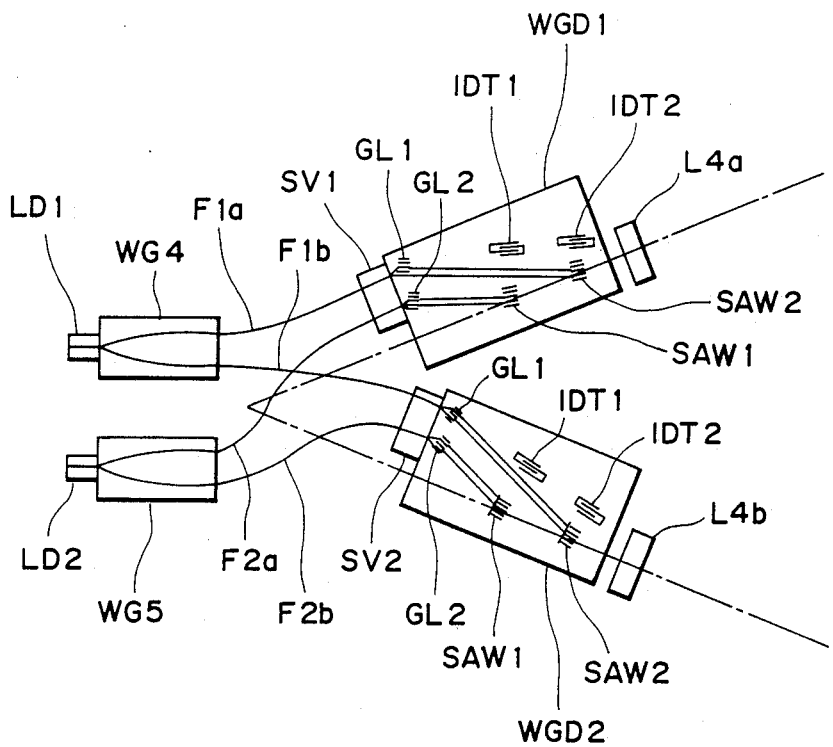
FIG. 5 is a section schematically showing a major portion of a position detecting device according to a further embodiment of the present invention.

Referring now to FIG. 5, description will be made of a position detecting device according to a further embodiment of the present invention.

FIG. 5 shows a major portion of the third embodiment. As shown in FIG. 5, the present embodiment uses semiconductor lasers LD1 and LD2, light-branching circuits WG4 and WG5, optical fibers F1a, F1b, F2a and F2b, optical waveguide type deflectors WGD1 and WGD2, and cylindrical lenses L4a and L4b. All of these components are provided in place of the portion, of the optical arrangement shown in FIG. 1, from the light source (lasers LD1–LD3) to the cylindrical lens L4 inclusive.

The principle of operation of the present embodiment will now be described. In this embodiment, the laser LD1 produces a laser beam of a wavelength $\lambda 1$ while the laser LD2 produces a laser beam of a different wavelength $\lambda 2$. Each of the laser beams from the lasers LD1 and LD2 is divided into two by means of corresponding one of the light-branching circuits WG4 and WG5. The divided laser beams of the wavelength $\lambda 1$ are directed to the waveguide type deflectors WGD1 and WGD2, respectively, by way of the optical fibers F1a and F1b coupled to these deflectors by means of couplers SV1 and SV2, respectively. On the other hand, the laser beams divided by the light-branching circuit WG5 and having the wavelength $\lambda 2$ are directed to the deflectors WGD1 and WGD2, respectively, by way of the optical fibers F2a and F2b also coupled to these deflectors by means of the couplers SV1 and SV2, respectively. In each of the waveguide type deflectors WGD1 and WGD2, the laser beams having the wavelengths $\lambda 1$ and $\lambda 2$, respectively, are deflected in accordance with the principle similar to that having been described with reference to FIG. 3. The deflectors WGD1 and WGD2 are disposed relatively inclinedly, such that a large angle of "deflection" is obtainable. Of course, in each of the deflectors WGD1 and WGD2, each laser beam can be deflected with a variable deflection angle by corresponding one of surface elastic waves SAW1 and SAW2.

While two semiconductor lasers and two waveguide type deflectors are used in the present embodiment, the number of the components is not limitative. Three or more lasers and deflectors may be used.

In the foregoing embodiments, description has been made to examples in which semiconductor lasers are used as the light source means. However, the invention is not limited to use of such semiconductor lasers. Other types of light sources may of course be used. For example, light-emitting diodes may be used, if desired.

In accordance with the present invention, as has hitherto been described, the position of the surface, being examined, can be detected at each of plural measuring points on that surface. This allows detection of any inclination of the surface being examined. Thus, the present invention assures realization of a high-accuracy automatic focusing system. Further, by using an optical integration circuit such as an optical waveguide type element for the combining of lights, the branching of the light and the deflecting of the light, the position detecting device can be made compact with the improved stability and reliability of the detection. Also, it avoids the necessity of complicated axis adjustment.

Moreover, according to the embodiments described hereinbefore, the deflection of the position detecting light is carried out by use of surface elastic waves or by switching semiconductor lasers. This allows high-speed plural-point measurement for the position detection.

While the invention has been described with reference to the structures disclosed herein, it is not confined to the details set forth and tis application is intended to cover such modifications or changes as may come within the purposes of the improvements or the scope of the following claims.

What is claimed is:

1. A device for detecting the position of an object, said device comprising:

a plurality of light sources from which lights advance along respective light paths;

an optical waveguide type path combining element for combining the light paths for the lights from said light source into one light path;

light guide means for guidingly directing, inclinedly to the object, the light coming along said one light path from said path combining element;

photoelectric converting means for receiving the light reflected from the object and for producing a signal in accordance with the light reception; and means for detecting the position of the object in accordance with the signal produced by said photoelectric converting means.

2. A position detecting device usable with an object having a surface, said device comprising:

light emitting means for emitting light, said light emitting means comprising a plurality of light sources for producing lights which are different in wavelength;

light guide means for guiding the light from said light emitting means so that the light is projected inclinedly upon plural locations on the object, said light guide means including a waveguide effective to combine the lights from said light sources;

photoelectric converting means for receiving the light reflected from the surface and for producing an electric signal corresponding to the position of incidence of the reflected light upon said photoelectric converting means; and processing means for receiving the electric signal from said photoelectric converting means and for detecting, on the basis of the electric signal from said photoelectric converting means, a positional deviation of the surface from a predetermined reference plane.

3. A device according to claim 2, wherein said light guide means comprises a plurality of said waveguides effective to combine the lights from said light sources, and a plurality of lenses formed on a curved base plate by an ion exchange method.

4. A position detecting device usable with an object having a surface, said device comprising:

light emitting means for emitting light;

light guide means for guiding the light from said light emitting means so that the light is projected inclinedly upon plural locations on the object, said light guide means comprising a first waveguide to divide the light from said light emitting means into a plurality of lights and further including a plurality of second waveguides effective to direct the lights from the first waveguide to different locations on the object;

photoelectric converting means for receiving the light reflected from the surface and for producing an electric signal corresponding to the position of incidence of the refelected light upon said photoelectric converting means; and processing means for receiving the electric signal from said photoelectric converting means and for detecting, on the basis of the electric signal from said photoelectric converting means, a positional deviation of the surface from a predetermined reference plane.

5. A position detecting device usable with an object having a surface, said device comprising:

light emitting means for emitting light;

light guide means for guiding the light from said light emitting means so that the light is projected inclinedly upon plural locations on the object, said light guide means comprising a waveguide for deflecting the light from said light emitting means;

photoelectric converting means for receiving the light reflected from the surface and for producing an electric signal corresponding to the position of the incidence of the reflected light upon said photoelectric converting means; and processing means for receiving the electric signal from said photoelectric converting means and for detecting, on the basis of the electric signal from said photoelectric converting means, a positional deviation of the surface from a predetermined reference plane.

6. A device according to claim 5, wherein said light emitting means includes a plurality of light sources for producing lights of different wavelengths and wherein said waveguide is effective to combine the lights from the different light sources.

7. A device according to claim 5, said light emitting means comprises a semiconductor laser for producing a laser beam of a wavelength in a range of 600–850 nm.

8. A device according to claim 5, wherein said waveguide comprises a waveguide layer and an interdigitating electrode provided on a base member, and wherein said interdigitating electrode produces a surface elastic wave effective to deflect a light from said light emitting means, advancing in said waveguide layer.

9. A device according to claim 8, wherein said light emitting means includes a plurality of light sources for producing lights of different wavelengths, wherein said waveguide includes a plurality of interdigitating electrodes and wherein the lights from said light sources are deflected by surface elastic waves from said interdigitating electrodes.

* * * * *

UNITED STATES PATENT AND TRADEMARK OFFICE
CERTIFICATE OF CORRECTION

PATENT NO. : 4,823,014
DATED : April 18, 1989
INVENTOR(S) : MAMORU MIYAWAKI

It is certified that error appears in the above-identified patent and that said Letters Patent is hereby corrected as shown below:

ON THE TITLE PAGE:

IN [56] REFERENCES CITED

Attorney, Agent, or Firm, "Fitzpatrick, Cella Harper & Scinto" should read --Fitzpatrick, Cella, Harper & Scinto--.

COLUMN 4

Line 8, "a focal" should read --afocal--.
    Line 35, "a focal" should read --afocal--.

COLUMN 6

Line 41, "axis." should read --axis--.

COLUMN 8

Line 13, "tis" should read --this--.

UNITED STATES PATENT AND TRADEMARK OFFICE
CERTIFICATE OF CORRECTION

PATENT NO. : 4,823,014
DATED : April 18, 1989
INVENTOR(S) : MAMORU MIYAWAKI

Page 2 of 2

It is certified that error appears in the above-identified patent and that said Letters Patent is hereby corrected as shown below:

COLUMN 10

Line 12, "claim 5, said" should read --claim 5, wherein said--.

Signed and Sealed this

Twenty-seventh Day of February, 1990

*Attest:*

JEFFREY M. SAMUELS

*Attesting Officer*     *Acting Commissioner of Patents and Trademarks*